(12) United States Patent
Cheung

(10) Patent No.: US 7,629,814 B2
(45) Date of Patent: Dec. 8, 2009

(54) LATCH CIRCUIT AND DESERIALIZER CIRCUIT

(75) Inventor: Tszshing Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/942,922

(22) Filed: Nov. 20, 2007

(65) Prior Publication Data

US 2008/0144399 A1 Jun. 19, 2008

(30) Foreign Application Priority Data

Dec. 18, 2006 (JP) ............................. 2006-340300

(51) Int. Cl.
    *H03K 19/20* (2006.01)
(52) U.S. Cl. ..................................... 326/104
(58) Field of Classification Search ................. 326/104, 326/82–87, 93, 95
    See application file for complete search history.

(56) References Cited

U.S. PATENT DOCUMENTS

| | | | |
|---|---|---|---|
| 4,888,498 A * | 12/1989 | Kadakia | ...................... 327/546 |
| 5,859,548 A | 1/1999 | Kong | |
| 5,903,169 A | 5/1999 | Kong | |
| 6,016,065 A | 1/2000 | Kong | |
| 6,028,453 A | 2/2000 | Kong | |
| 6,211,704 B1 | 4/2001 | Kong | |
| 7,202,706 B1 * | 4/2007 | Plasterer et al. | .............. 326/127 |
| 2004/0036541 A1 | 2/2004 | Fang et al. | |

FOREIGN PATENT DOCUMENTS

| | | |
|---|---|---|
| JP | 02-182026 A | 7/1990 |
| JP | 04-290303 A | 10/1992 |
| JP | 06-343042 A | 12/1994 |
| JP | 08-250984 A | 9/1996 |
| JP | 10-117140 A | 5/1998 |
| JP | 2002-158565 A | 5/2002 |
| JP | 2004-088784 A | 3/2004 |

OTHER PUBLICATIONS

James Montanaro, et al. "A 160-MHz, 32-b, 0.5-W CMOS RISC Microprocessor" IEEE Journal of Solid-State Circuits, vol. 31, No. 11, Nov. 1996.
Japanese Office Action mailed Apr. 7, 2009 regarding JP Patent Application No. 2006-340300. A partial English-language translation is provided.).

* cited by examiner

*Primary Examiner*—Rexford N Barnie
*Assistant Examiner*—Thienvu V Tran
(74) *Attorney, Agent, or Firm*—Fujitsu Patent Center

(57) ABSTRACT

A latch includes a precharging unit, a memory logic unit, an input amplifying unit, and a clock synchronization switch. The memory logic unit and the input amplifying unit are arranged in a same transistor level. Thus, the latch has three transistor levels. Further, a current supply 150 is connected to the memory logic unit to control a current flowing through the memory logic unit.

18 Claims, 18 Drawing Sheets

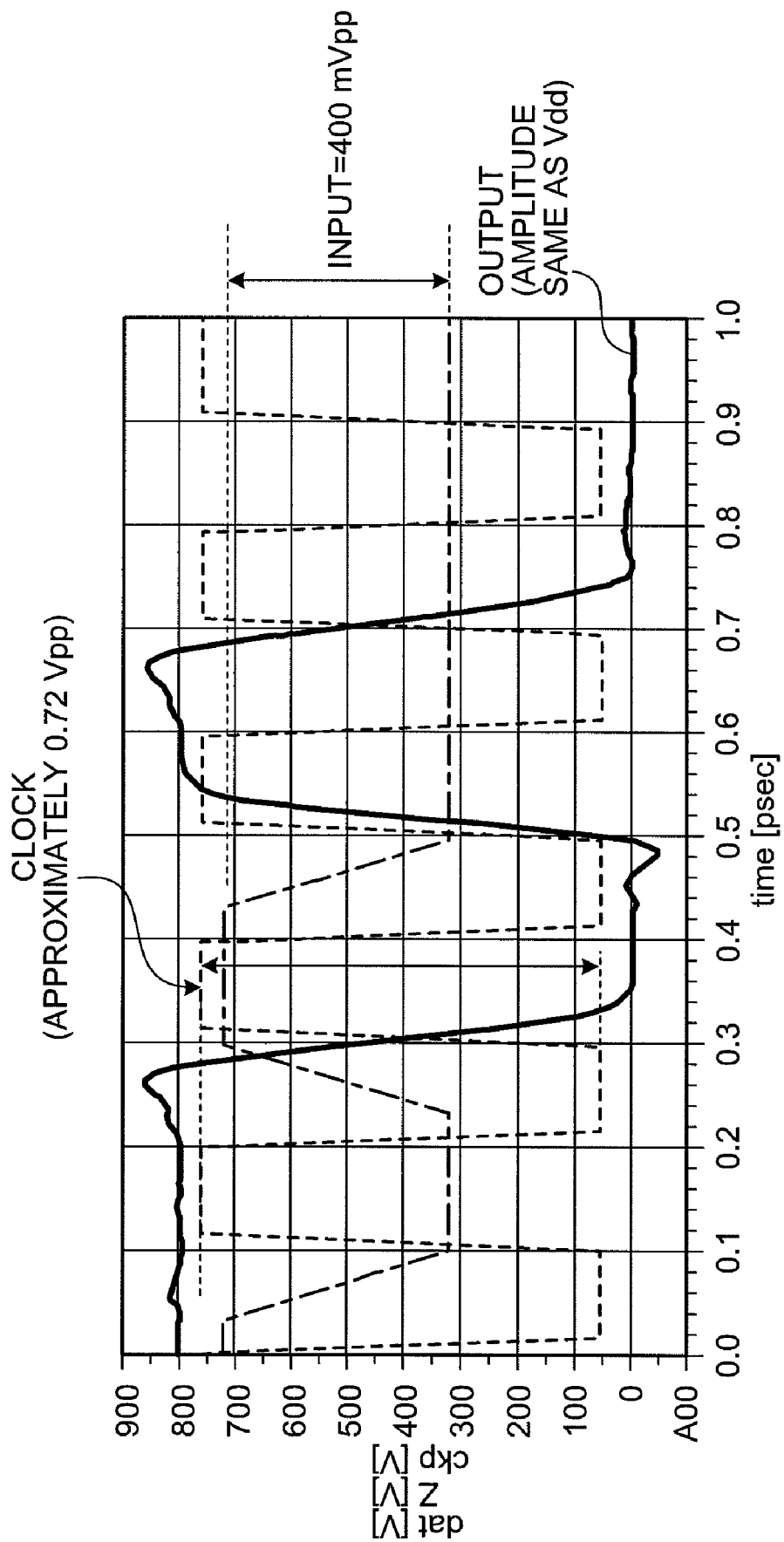

FIG.6

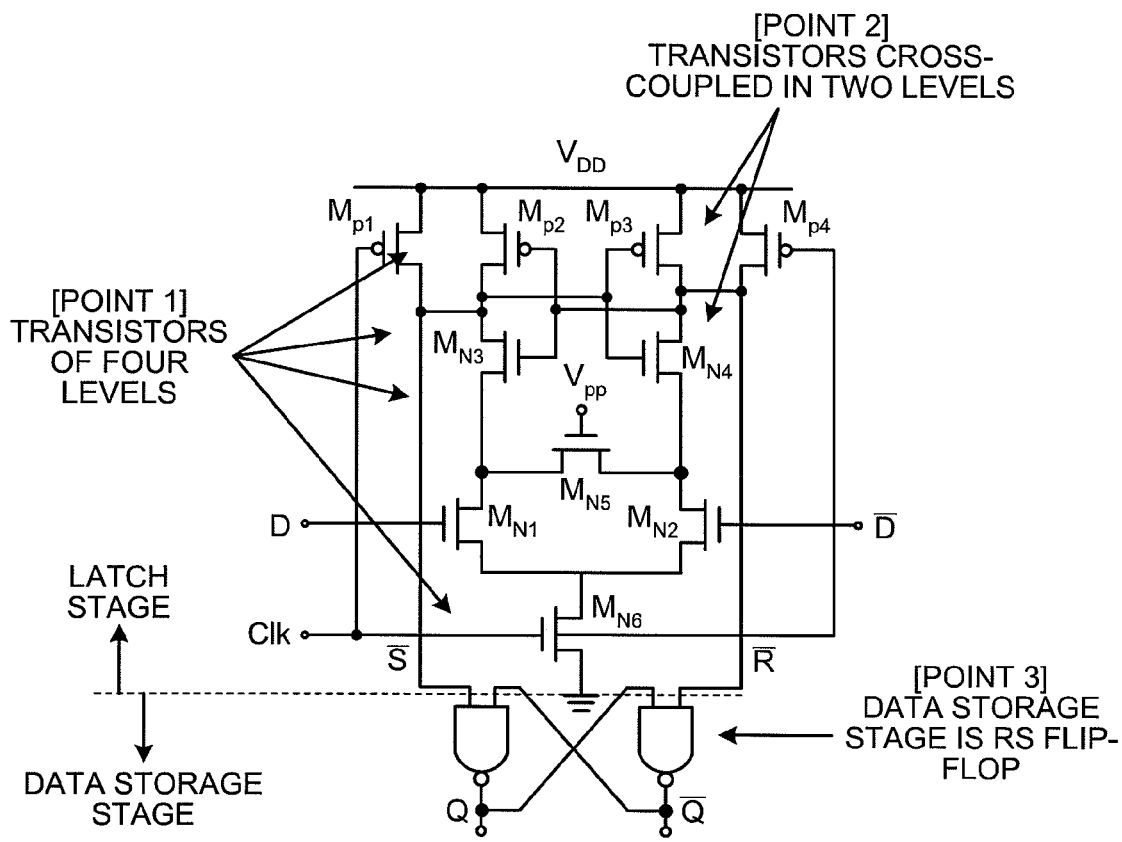

[POINT 2] TRANSISTORS CROSS-COUPLED IN TWO LEVELS

[POINT 1] TRANSISTORS OF FOUR LEVELS

LATCH STAGE
↕
DATA STORAGE STAGE

[POINT 3] DATA STORAGE STAGE IS RS FLIP-FLOP

FIG.7

| | COMMONLY USED | PRESENT EMBODIMENT |
|---|---|---|
| NUMBER OF TRANSISTORS | 18 | 15 |
| MINIMUM POWER SUPPLY VOLTAGE | 0.8 V | 0.6 V |
| POWER CONSUMPTION (FREQUENCY 5 GHz) | 960 uW | 900 uW |
| POWER CONSUMPTION (FREQUENCY 10 GHz) | 3000 uW (*1) | 900 uW (*2) |
| MAXIMUM OPERATING FREQUENCY (Vdd=0.8 V) | 3.0 GHz | 4.3 GHz |
| MAXIMUM OPERATING FREQUENCY (Vdd=1.2 V) | 6.0 GHz | 10.0 GHz |

NOTE (*1) Vdd=2.0 V
(*2) Vdd=1.2 V; EXCLUDING POWER CONSUMPTION OF WAVE-SHAPING INVERTER

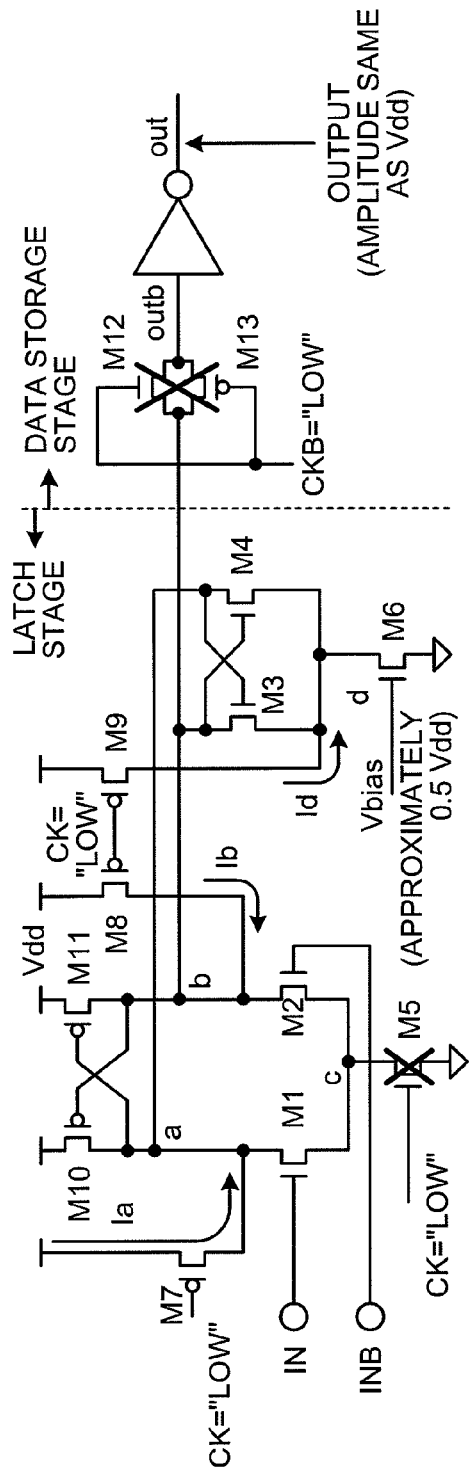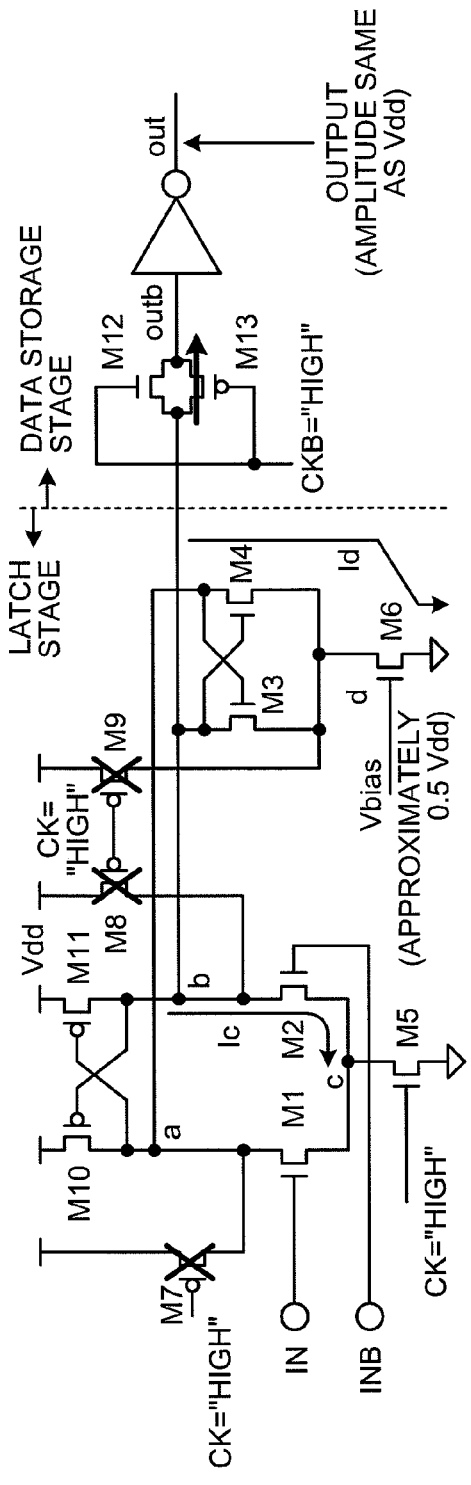

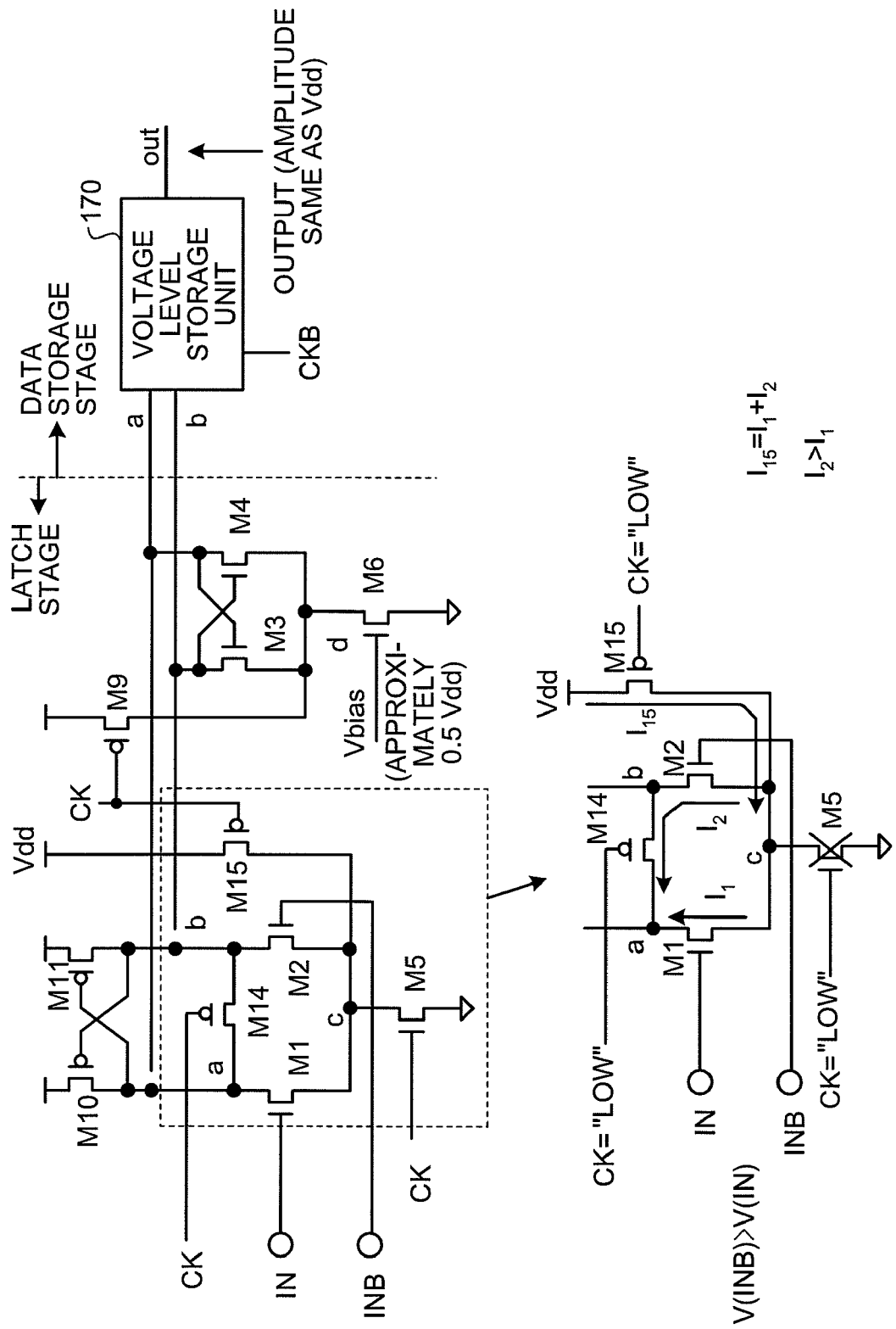

LATCH CIRCUIT AND DESERIALIZER CIRCUIT

BACKGROUND OF THE INVENTION

1. Field of the Invention

The present invention relates to a latch circuit that includes an input amplifying circuit that amplifies input signals and a memory logic circuit which stores data included in the input signals by using signals amplified by the input amplifying circuit, and a deserializer circuit that uses the latch circuit, and, more particularly relates to a latch circuit and a deserializer circuit which operate at high speed with low power consumption.

2. Description of the Related Art

A latch, which is a circuit that stores data, is used in various circuits such as a serializer/deserializer (SerDes) of a receiving device of a communication system of 40 gigabit per second (Gbps). FIG. 14A is a functional block diagram of a commonly used latch that is compatible with a small-amplitude input. As shown in FIG. 14A, the commonly used latch that is compatible with the small-amplitude input includes a precharging unit 110 at a first transistor level, a memory logic unit 120 at a second transistor level, an input amplifying unit 130 at a third transistor level, and a clock synchronization switch 140 at a forth transistor level. The clock synchronization switch 140 is synchronized with a clock. When clock signals are "high", the switch is on, and when the clock signals are "low", the switch is off.

The precharging unit 110 is a circuit that preliminarily sets voltages of nodes a and b to "high" during a first half of a clock (i.e., in a precharge time) so as to speed up data storage performed during a second half of the clock (i.e., in a latch time). Through the nodes "a" and "b", voltages are supplied to a data storage stage. The memory logic unit 120 is a circuit that stores a voltage difference generated in accordance with the input data in the second half of the clock. The input amplifying unit 130 is a current mode logic that amplifies small-amplitude input signals and generates a voltage difference that is stored as data in the memory logic unit 120. The clock synchronization switch 140 is a switch that realizes transition between the precharge time and the latch time in synchronization with the clock. An example of the commonly used latch is indicated in J. Montanaro, R. T. Witek, K. Anne, A. J. Black, E. M. Cooper, D. W. Dobberpuhl, P. M. Donahue, J. Eno, W. Hoeppner, D. Kruckemyer, T. H. Lee, P. C. M. Lin, L. Madden, D. Murray, M. H. Pearce, S. Santhanam, K. J. Snyder, R. Stehpany, and S. C. Thierauf, "A 160-MHz, 32-b, 0.5-W CMOS RISC Microprocessor, "IEEE J. Solid-State Circuits 31, No. 11, 1703-1714(November 1996).

The commonly used latch described above, however, has a problem. The commonly used latch that is compatible with the small-amplitude input shown in FIG. 14A is configured with four levels of transistors. Therefore, a power supply voltage Vdd needs to be greater than 4Vth, which makes the level of the power supply voltage Vdd high. Here, Vth is a threshold voltage of the operation of the transistor.

In addition, As shown in FIG. 14B, a propagation delay time from an input of a clock signal CK till an output of a voltage difference V(a)–V(b) is approximately td1+2*td2, where td1 is a propagation delay time from a gate node to a source node of a metal-oxide-semiconductor field-effect transistor (MOSFET) and td2 is a propagation delay time from the source node to a drain node of the MOSFET. Normally, td1 is 30 to 50 percents of td2. Hence, the propagation delay time Tpd of the commonly used latch is expressed as Tpd=0.4× td2+2×td2=2.4td2. Therefore, a half of the clock cycle needs to be more than or equal to 2.4td2, which is a restriction on a maximum operating frequency.

SUMMARY OF THE INVENTION

It is an object of the present invention to at least partially solve the problems in the conventional technology.

According to one aspect of the present invention, a latch circuit includes an input amplifying circuit that amplifies input signals, and a memory logic circuit that stores data included in the input signals using signals that are amplified by the input amplifying circuit, wherein the input amplifying circuit and the memory logic circuit are arranged at a same transistor level.

According to another aspect of the present invention, a deserializer circuit includes a latch circuit as a front-end circuit that includes an input amplifying circuit that amplifies input signals, and a memory logic circuit that stores data included in the input signals using signals that are amplified by the input amplifying circuit, wherein the input amplifying circuit and the memory logic circuit in the latch circuit are arranged in a same transistor level.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5B is a graph indicating a simulation result (when Vdd=0.8V) of the latch according to the embodiment;

FIG. 6 is an example of a CMOS transistor level design of a commonly used latch;

FIG. 7 is a table that indicates a result of comparison between the commonly used latch and the latch according to the embodiment;

FIGS. 8A and 8B are circuit diagrams for explaining operations of the latch shown in FIG. 3A;

FIG. 11B is circuit diagram of a second example of the another CMOS transistor level design of the latch according to the embodiment;

DETAILED DESCRIPTION OF THE PREFERRED EMBODIMENTS

Exemplary embodiments of the latch circuit and the deserializer circuit according to the present invention are explained in detail below with reference to the accompanying drawings. In the following description of the embodiment, an application of the present invention to a high-speed receiving device which receives optical signals of 40 gigabits per second (Gbps) is mainly explained.

Figure 1:
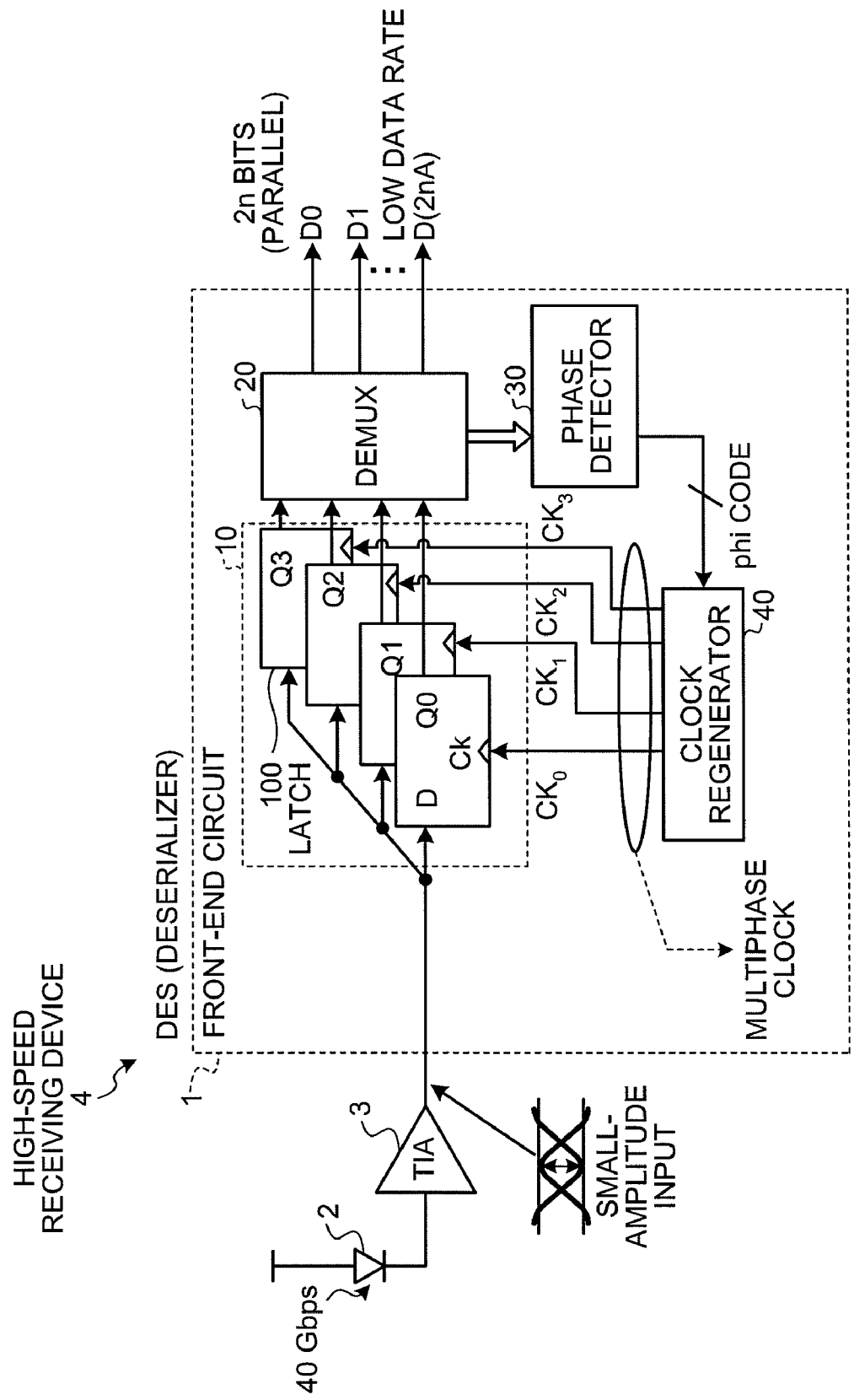
FIG. 1 is a functional block diagram of a deserializer according to an embodiment of the present invention.

A deserializer according to the present embodiment is explained first. FIG. 1 is a functional block diagram of the deserializer according to the present embodiment. As shown in FIG. 1, a deserializer 1 makes up, together with a photodiode 2 that converts optical signals into electrical signals and a transimpedance amplifier (TIA) 3 that amplifies the electrical signals that are output by the photodiode 2, a high-speed receiving device 4. Further, the deserializer 1 includes a front-end circuit 10, a demultiplexer (DEMUX) 20, a phase detector 30, and a clock regenerator (also called a clock generator) 40.

The front-end circuit 10 includes four latches 100. Each latch 100 takes out data from the electrical signals that are output by the TIA 3 and passes the data to the DEMUX 20. Due to bandwidth limitations of a photoelectric converter at a high data transfer rate, signals each of the latches 100 receives are small-amplitude signals that are smaller than Vdd. Therefore, in the high-speed receiving device 4, the high-speed front-end circuit 10 that is compatible with the small-amplitude input is important. Because the high-speed receiving device 4 receives the optical signals of 40 Gbps, it is necessary to operate each latch 100 at 40 Gbps/4=10 Gbps.

The DEMUX 20 is a circuit that creates parallel data of 2n bits from data output by each latch 100. The phase detector 30 is a circuit that detects a phase shift when the parallel data is created and passes the detected phase shift to the clock regenerator 40 as phi code. The clock regenerator 40 is a circuit that generates multiphase clocks $CK_0$ to $CK_3$, in each of which the phase is lagged by 90 degrees, and supplies the multiphase clocks $CK_0$ to $CK_3$ to latches 100, respectively. Furthermore, the clock regenerator 40 receives the phi code as an input and corrects the phase shift.

Figure 2A:
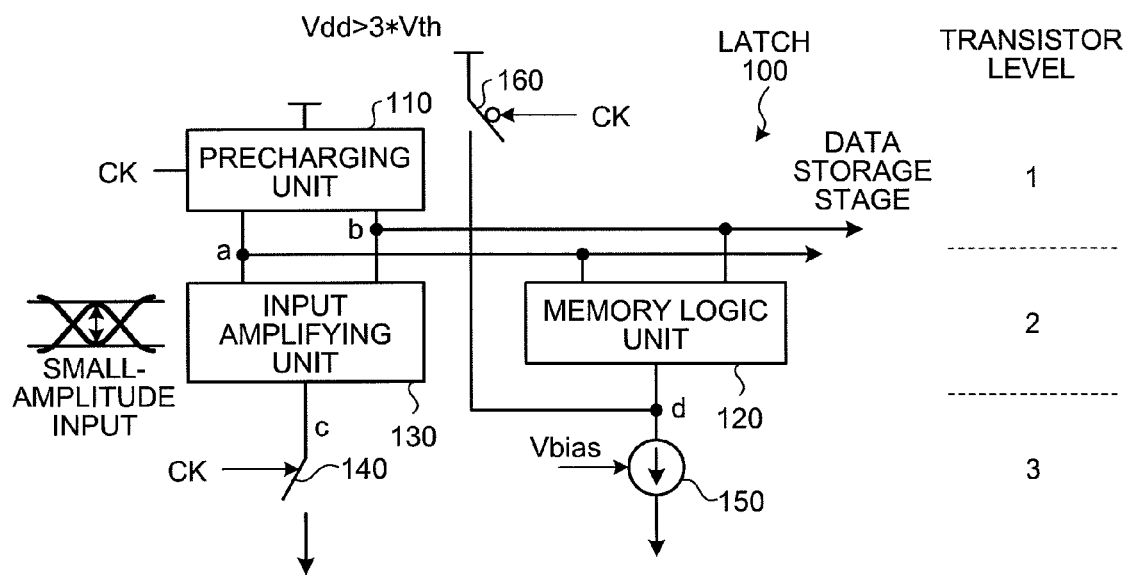
FIG. 2A is a functional block diagram of a latch according to the embodiment of the present invention.

A structure of the latch 100 according to the present embodiment is explained next. FIG. 2A is a functional block diagram of the latch 100 according to the present embodiment. As shown in FIG. 2A, similarly to the commonly used latch, the latch 100 includes a precharging unit 110, a memory logic unit 120, an input amplifying unit 130, and a clock synchronization switch 140, and instead of arranging at the different transistor level, arranges the memory logic unit 120 and the input amplifying unit 130 at the same transistor level.

Consequently, the total number of transistor levels is three. Under the condition of Vtp=Vtn=Vth, it is sufficient if Vdd is greater than 3Vth. Therefore, Vdd can be reduced and power consumption can also be reduced. Here, Vtp is a threshold voltage of a p-type metal-oxide-semiconductor field-effect transistor (MOSFET); Vtn is the threshold voltage of an n-type MOSFET; and Vth is the average threshold voltage of the p-type and the n-type MOSFETs.

Further, the latch 100 includes a current supply 150 which receives a power supply voltage of Vbias and is connected to the memory logic unit 120, so as to control the magnitude of a current flowing through the memory logic unit 120. With the current supply 150 controlling the magnitude of the current flowing through the memory logic unit 120, generation of voltage V(a,b) for the data storage by the memory logic unit 120 can be speed up, and the noise of V(a,b) can be minimized.

Figure 2B:
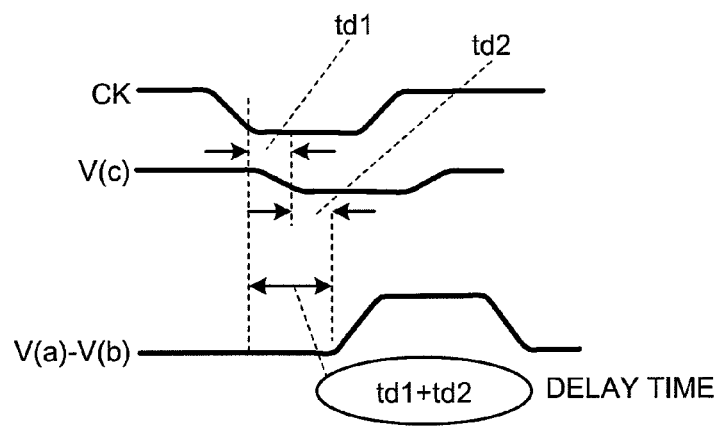
FIG. 2B is a timing chart of the latch shown in FIG. 2A.

As shown in FIG. 2B, because there are three transistor levels in the latch 100, the propagation delay time from an input of a clock signal CK till an output of a voltage difference V(a)−(b) can be reduced to td1+td2. Therefore, Tpd can be expressed as Tpd=0.4×td2+td1=1.4td2, whereby the maximum operating frequency can be improved, at least ideally, by not less than 40 percents in comparison with the commonly used latch.

In the latch 100, the generation of voltage on the nodes a and b can be speeded up since a node d is precharged via a reverse clock synchronization switch 160. The reverse clock synchronization switch 160 is synchronized with a reverse clock. When clock signals are "low", the switch 160 is on, and when the clock signals are "high", the switch 160 is off.

Figure 3A:
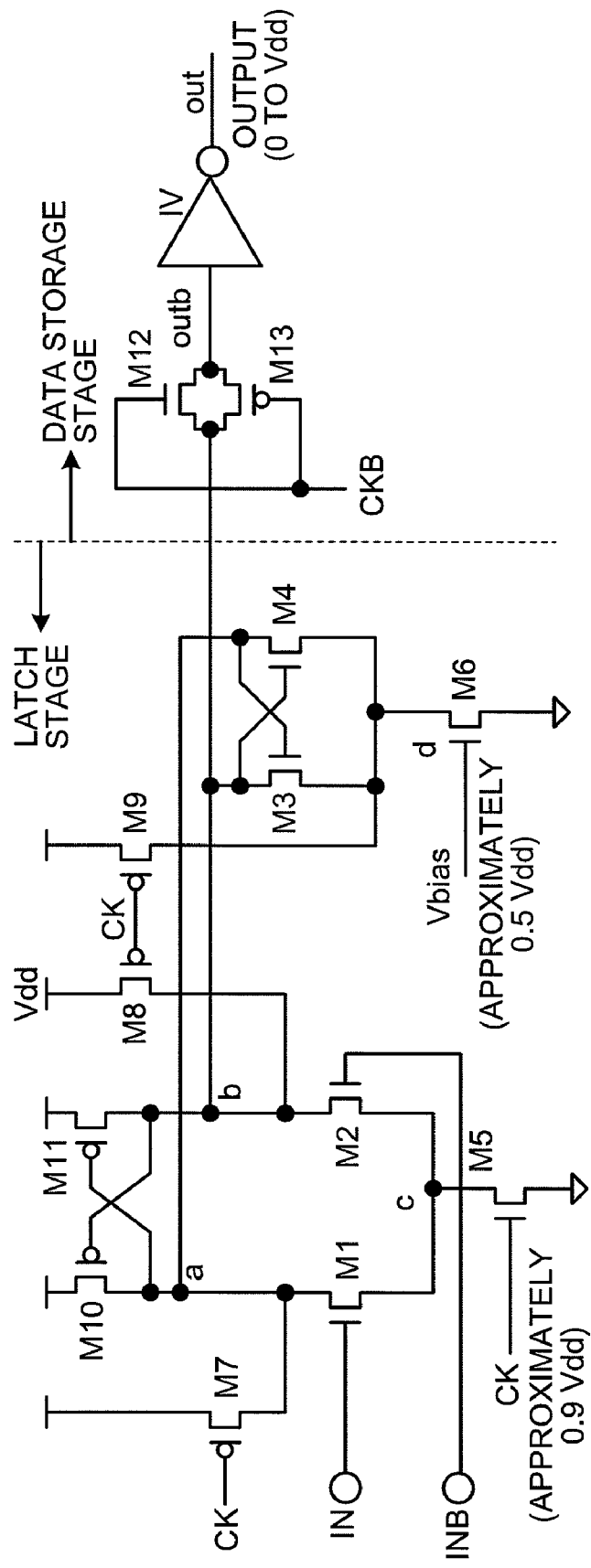
FIG. 3A is an example of a CMOS transistor level design of the latch shown in FIG. 2A.

FIG. 3A is an example of a complementary metal-oxide-semiconductor (CMOS) transistor level design of the latch 100 shown in FIG. 2A. As shown in FIG. 3A, the precharging unit 110 is configured with four p-type metal-oxide semiconductor (pMOS) transistors M7, M8, M10, and M11. The memory logic unit 120 is formed of a pair of cross-coupled n-type metal-oxide semiconductor (nMOS) transistors M3 and M4.

By periodically precharging the voltage of the node d to Vdd-Vth, a precharging speed of the nodes a and b can be increased. When a pMOS transistor M9 is employed for precharging the node d, the precharging speed of the nodes a and b can be further enhanced.

The voltage of the node b is converted into an output having an amplitude of Vdd by two transistors M12 and M13 driven by a clock CKB and an inverter IV. Here, "B" of CKB indicates a phase difference, and CKB is a clock which has a phase difference from the clock CK.

Figure 3B:
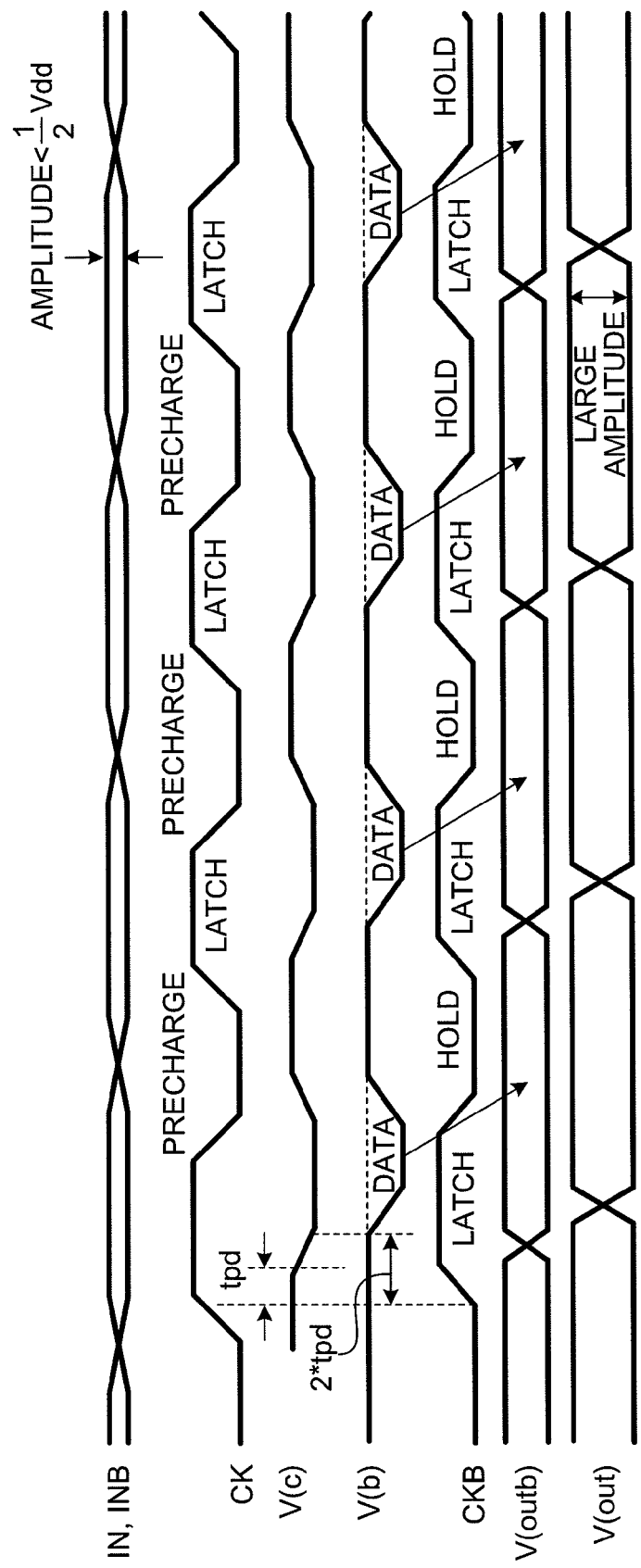
FIG. 3B is a timing chart of the latch shown in FIG. 3A.

As shown in a timing chart of FIG. 3B, data (IN, INB) is latched at a timing of "latch" of the voltage V(b) of the node b, and in the data storage stage, V(b) is latched at the timing of "latch" that corresponds to V(outb). The amplitude of the voltage V(outb) is converted into Vdd by the inverter IV and is held in the data storage stage during "hold" time. Here, INB is an opposite of IN. The voltage Vbias supplied to the current supply 150 is approximately a half of Vdd.

Figure 4A:
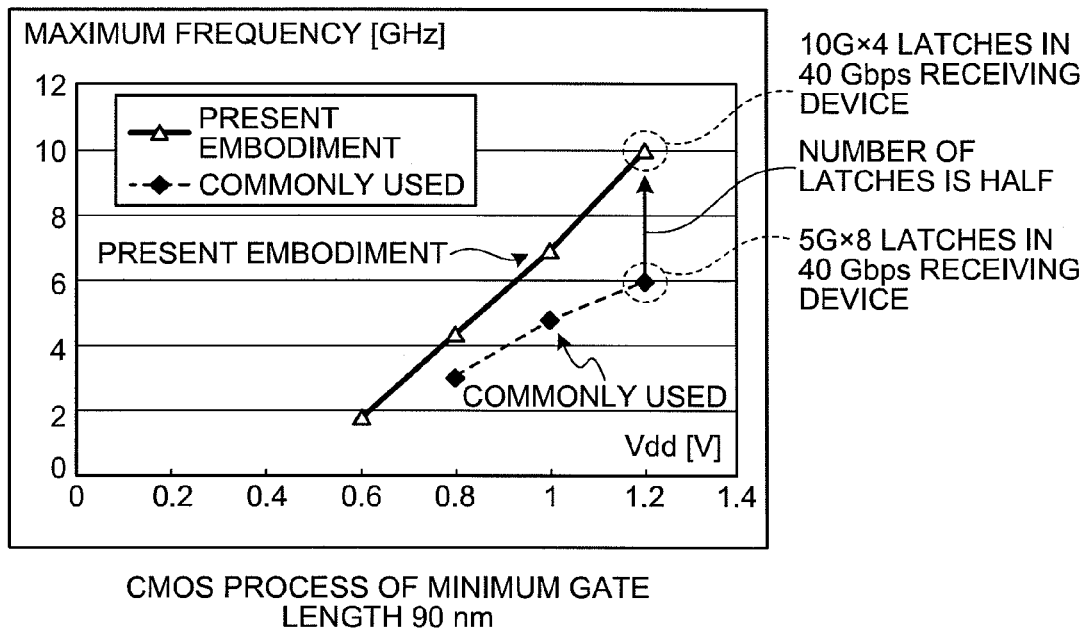
FIG. 4A is a graph indicating a simulation result of the maximum operating frequency.

A performance of the latch 100 according to the present embodiment is explained below with reference to FIGS. 4A to 7. FIG. 4A is a graph indicating a simulation result of the maximum operating frequency. As shown in FIG. 4A, when standard CMOS process parameters (also called a CMOS model) for a minimum gate length of 90 nanometers (nm) similar to Berkeley Predictive Technology Model (BPTM) is employed, the maximum operating frequency of the latch 100 upon Vdd=1.2V is 10 gigahertz (GHz) and the maximum operating frequency of the commonly used latch is 5.7 GHz.

Therefore, in the high-speed receiving device 4 of 40 Gbps, the front-end circuit 10 configured with four latches 100 of 10 GHz can be mounted. Thus, the number of latches can be reduced to half of the commonly used latch.

Figure 4B:
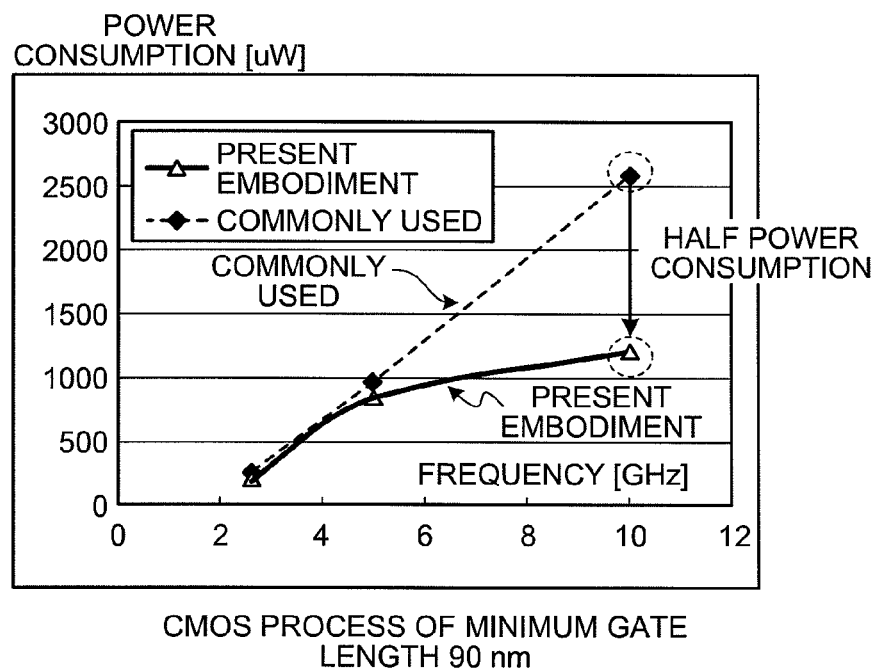
FIG. 4B is a graph indicating a simulation result of power consumption.

FIG. 4B is a graph indicating a simulation result of power consumption. As shown in FIG. 4B, the same CMOS parameters as employed in the simulation shown in FIG. 4A are used. When the operating frequency is 10 GHz, power consumed by the latch 100 of the present embodiment is half of power consumed by the commonly used latch. Further, though the latch 100 of the present embodiment can operate at Vdd=0.6V, the commonly used latch can operate only when Vdd is equal to or greater than 0.8V. Still further, when Vdd is between 0.8V and 1.2V, the maximum operating frequency of the latch 100 of the present embodiment is at least 30 percent higher than that of the commonly used latch.

Figure 5A:
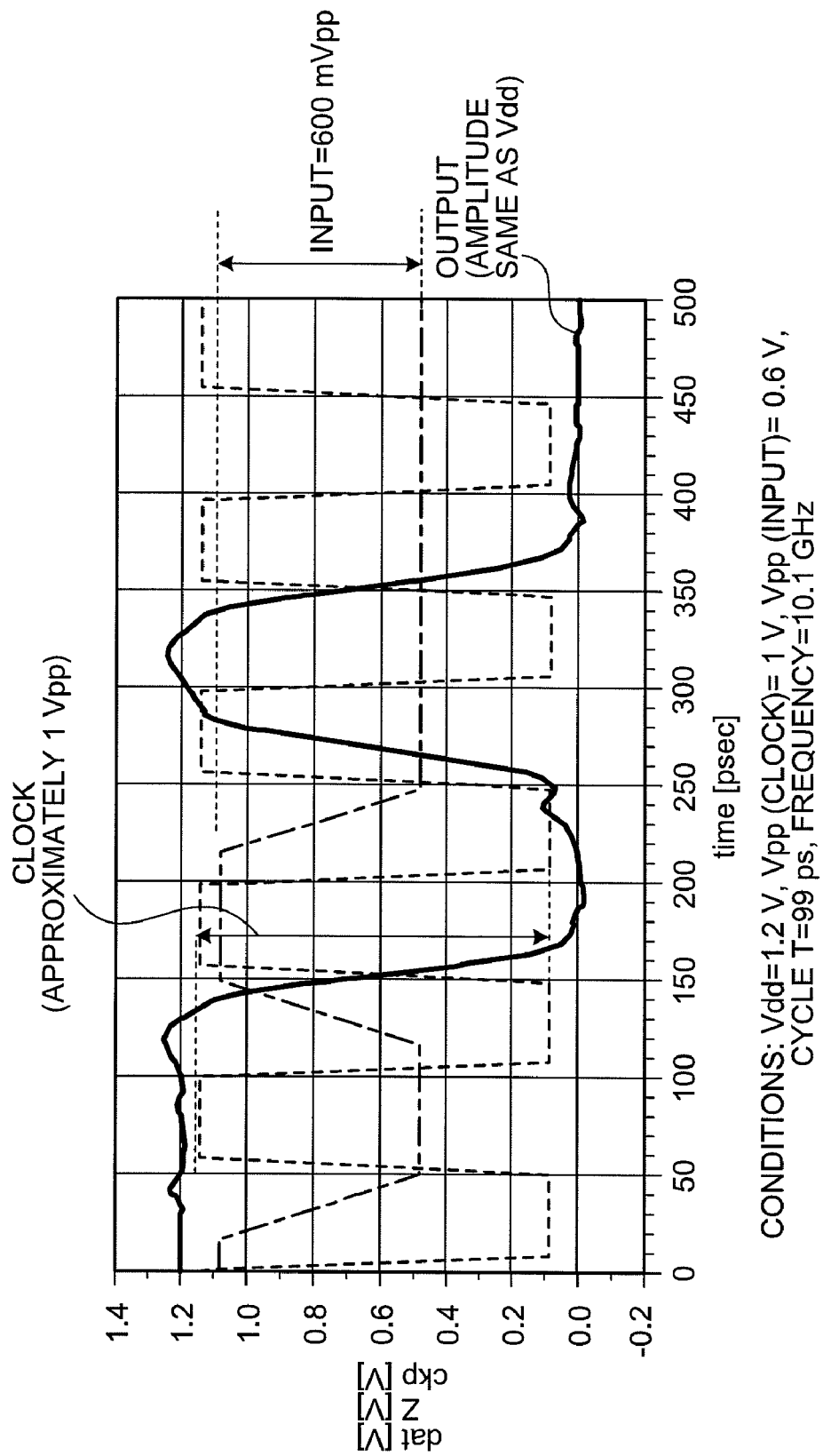
FIG. 5A is a graph indicating a simulation result (when Vdd=1.2V) of the latch according to the embodiment.

FIG. 5A is a graph indicating a simulation result (when Vdd=1.2V) of the latch 100 according to the present embodiment. By using the standard 90 nm CMOS parameters, simulation is carried out. A clock cycle is 99 picoseconds (ps) and a frequency is 10.1 GHz.

As shown in FIG. 5A, peak-to-peak voltage Vpp (input) is 0.6V, Vpp (clock) is 1V, and the amplitude of an output voltage is Vdd. Similarly to a synchronization circuit of a serializer/deserializer (SerDes), the latch 100 can be directly connected to a logic circuit and is useful for high-speed receiving devices. Output data out is synchronized with the clock CK and is insignificantly affected by the noise of the power supply voltage Vdd.

FIG. 5B is a graph indicating a simulation result (when Vdd=0.8V) of the latch 100 according to the present embodiment. The clock cycle is 198 ps and the frequency is 5.1 GHz. As shown in FIG. 5B, Vpp (input) is 0.4V, Vpp (clock) is 0.72V, and the amplitude of the output voltage is Vdd.

When the latch 100 according to the present embodiment is compared with a commonly used latch shown in FIG. 6, the maximum operating frequency is approximately double in the latch 100. The commonly used latch shown in FIG. 6 is different from the latch 100 of the present embodiment in that: the transistor levels are four; the transistors are cross-coupled in two levels; and the data storage stage is configured with a reset-and-set (RS) flip-flop.

FIG. 7 is a table indicating a result of comparison of the features and the performance of the commonly used latch and the latch 100 of the present embodiment. The commonly used latch that is compared is shown in FIG. 6. As shown in FIG. 7, in comparison with the commonly used latch, the latch 100 of the present embodiment has a smaller number of transistors, less minimum power supply voltage, consumes less power both at 5 GHz and 10 GHz, and has a higher maximum operating frequency both at Vdd=0.8V and Vdd=1.2V.

The commonly used latch can operate at 10 GHz only when Vdd is equal to or greater than 2.0V, which is an inappropriate voltage level for most of LSI circuitry of the CMOS. In the above, the consumed power does not include power consumed by the wave-shaping inverter IV.

Operations of the latch 100 shown in FIG. 3A are explained next. FIGS. 8A and 8B are circuit diagrams for explaining operations of the latch 100 shown in FIG. 3A. FIG. 8A shows the operations when the clock CK is "low", whereas FIG. 8B shows the operation when the clock CK is "high". The phase difference between the clock CK and the clock CKB is 30 degrees.

As shown in FIG. 8A, when the clock CK is "low", a transistor M5 is turned off and the transistors M7 and M8 are turned on. Then, currents Ia and Ib pass through the respective transistors M7 and M8, and the voltage V(a) of the node a and the voltage V(b) of the node b approach Vdd-Vtp. Here, Vtp is the threshold voltage of M7 and M8 those are pMOSFETs. At the same time, a current Id passes through the transistor M6 and the voltage V(d) of the node d approaches Vdd-Vtp. Further, when the clock CKB is "low", the transistors M12 and M13 are off and retain V(outb) and V(out) at previous values.

As shown in FIG. 8B, when the clock CK is "high", the transistor M5 is turned on and the transistors M7 and M8 are turned off. Then, a current Ic flows through the transistors M1 or M2 according to voltage level difference of the input data (IN, INB). At the same time, the current Id flows through the transistors M3 or M4 and voltage levels of the nodes a and b are stabilized. In other words, the voltage V(a) and V(b) of the nodes a and b are updated. Further, when the clock CKB is "high", the transistors M12 and M13 are on and V(outb) and V(out) are updated.

Figure 9A:
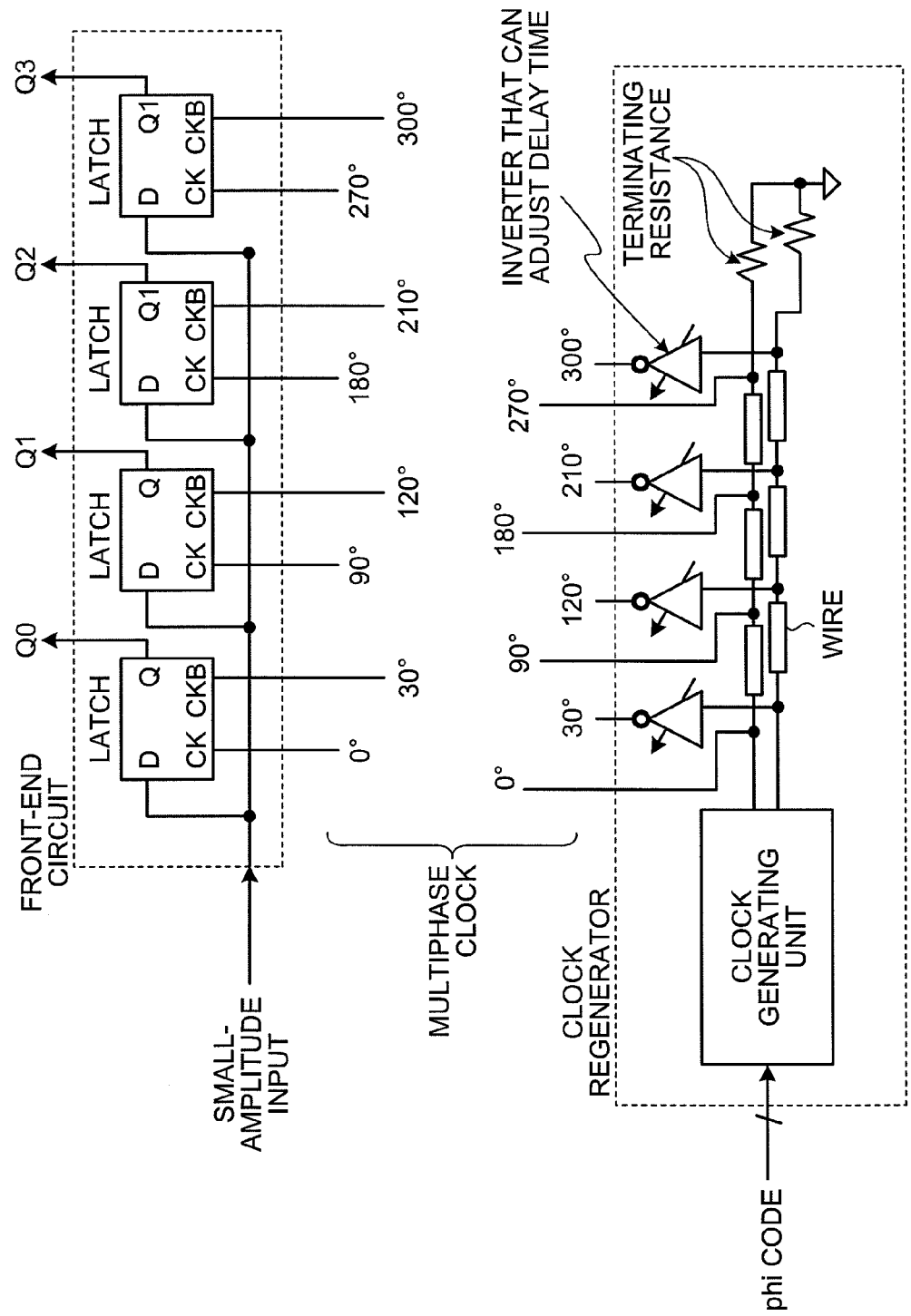
FIG. 9A is a circuit diagram of a first example of a clock regenerator.
Figure 9B:
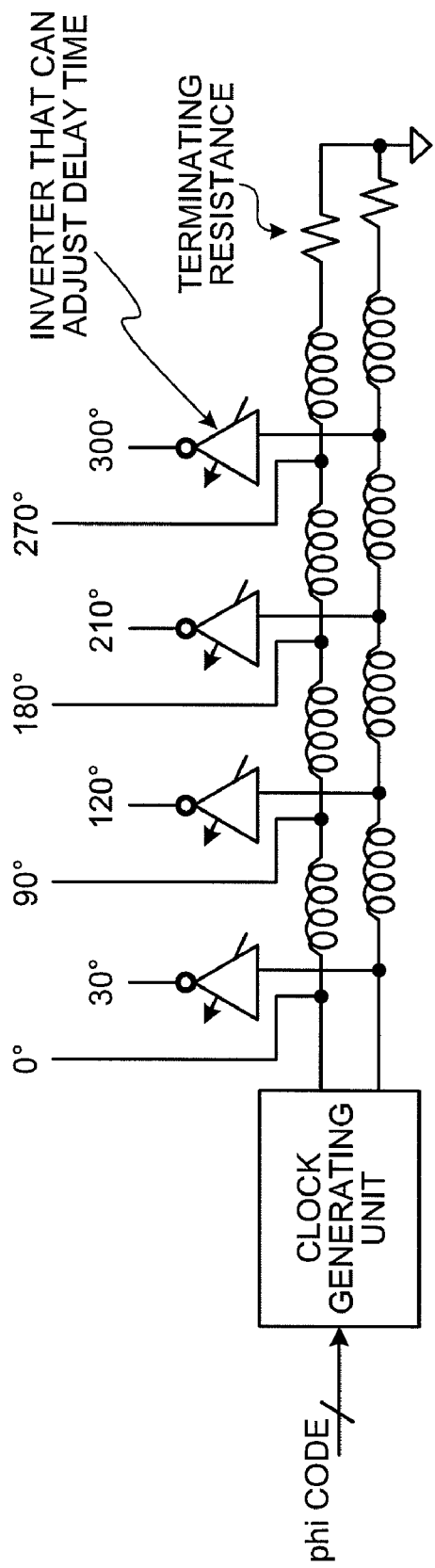
FIG. 9B is a circuit diagram of a second example of the clock regenerator.

The example of a transistor level design of the clock regenerator 40 shown in FIG. 1 is explained with reference to FIGS. 9A to 9C. The clock regenerator generates eight multiphase clocks in which the phases are lagged by 0 degree, 30 degrees, 90 degrees, 120 degrees, 180 degrees, 210 degrees, 270 degrees, and 300 degrees, respectively. In the clock regenerator shown in FIG. 9A, a metal wire pattern on the LSI is used as a delay element and a terminating resistance is used in a terminal of a delay line. The clocks in which the phase is lagged by 30 degrees, 120 degrees, 210 degrees, and 300 degrees, respectively, are generated by inverters that can adjust a delay time, respectively. In the clock regenerator shown in FIG. 9B, an inductor on the LSI is used as the delay element and the terminating resistance is used in the terminal of the delay line.

Figure 9C:
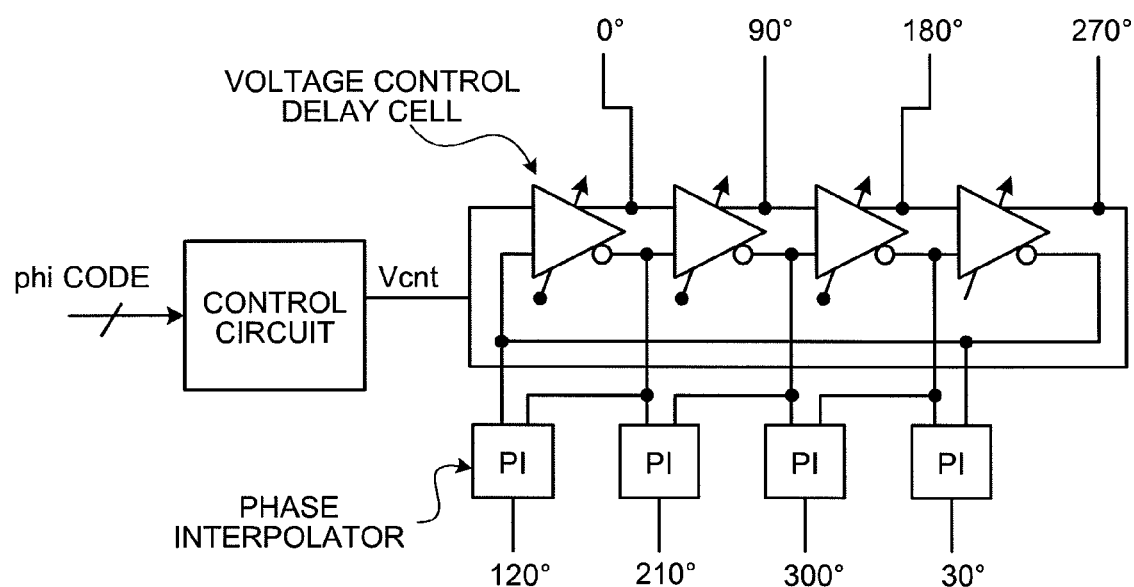
FIG. 9C is a circuit diagram of a third example of the clock regenerator.

In the clock regenerator shown in FIG. 9C, a four-staged ring oscillator that includes four voltage control delay cells each including differential inputs and differential outputs is used for generating four multiphase clocks. A control voltage Vcnt from a control circuit controls a clock frequency. The control circuit acquires phase data from the phi code from the phase detector 30. Furthermore, four phase interpolators (PI) are used for generating other four multiphase clocks.

Figure 10A:
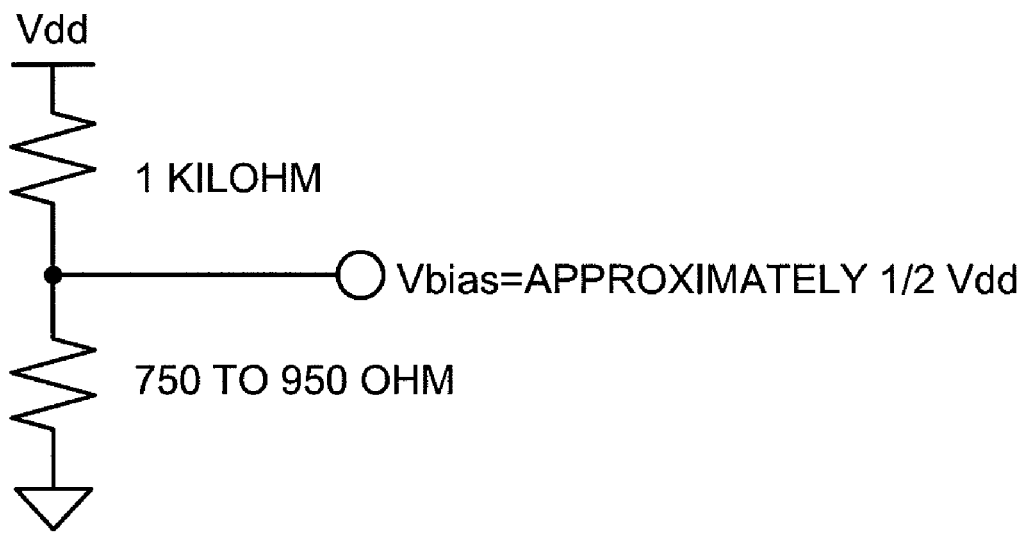
FIG. 10A is a circuit diagram of a bias circuit.

A bias circuit that generates the power supply voltage Vbias of the current supply 150 shown in FIG. 2A is explained next. FIG. 10A is a circuit diagram of the bias circuit. As shown in FIG. 10A, the bias circuit generates the voltage Vbias which is approximately half of Vdd using two resistors. As Vbias for FIG. 3A, a value smaller than half of Vdd is used.

Figure 10B:
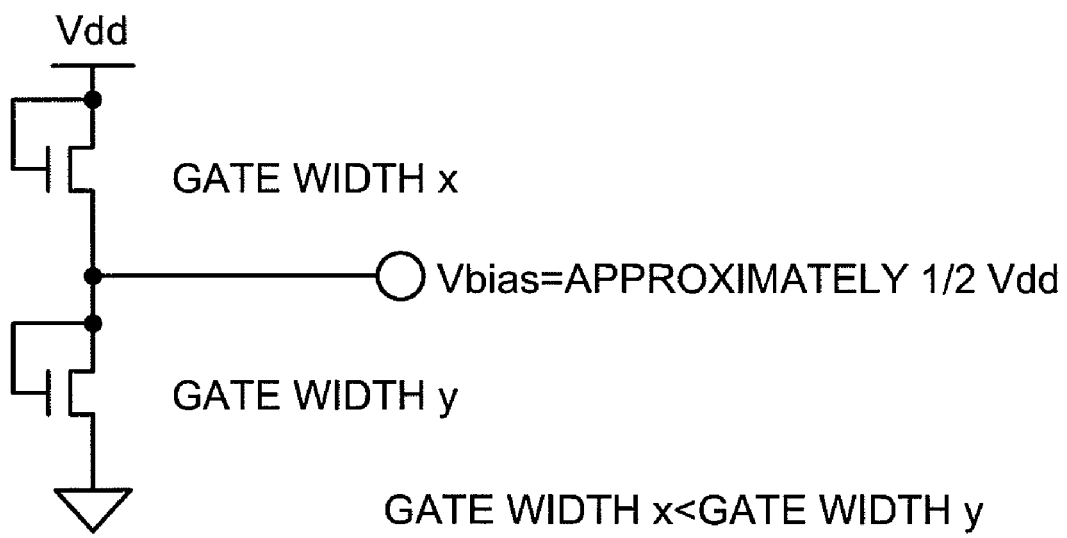
FIG. 10B is a circuit diagram of another bias circuit.

FIG. 10B is a circuit diagram of another bias circuit. As shown in FIG. 10B, this bias circuit generates the voltage Vbias which is approximately half of Vdd by using two n-type MOSFETs. In this bias circuit, a gate width x is smaller than a gate width y and the value of the Vbias is smaller than half of Vdd. Here, the gate width means the gate width of the MOSFET.

Figure 11A:
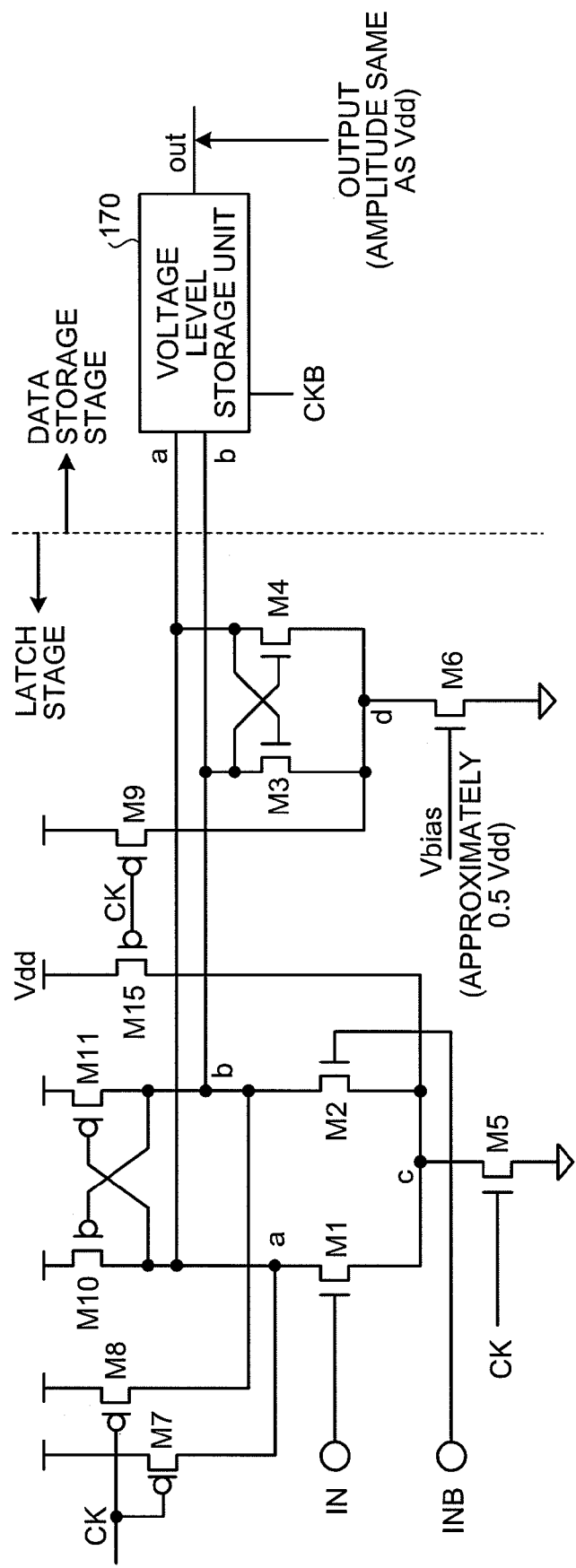
FIG. 11A is a circuit diagram of a first example of another CMOS transistor level design of the latch according to the embodiment.

Examples of other CMOS transistor levels of the latch 100 of the present embodiment are explained with reference to FIGS. 11A to 12B. FIG. 11A is the first example of the other CMOS transistor level design of the latch 100 of the present embodiment. The example of FIG. 11A is different from the example of FIG. 3A in that a pMOSFET M15 is added, and that the node c is also precharged to Vdd-Vth when the clock CK is "low".

As shown in FIGS. 5A and 5B, a direct current voltage level of IN and INB is normally greater than half of the Vdd. Hence, M1 and M2 are partially on. Then, the precharging of the nodes a and b can be speeded up by the precharging of the node c, whereby the precharge time can be shortened. This transistor level design is employed when it is necessary to shorten the precharge time. In FIG. 11A, the data storage stage is indicated as a voltage level storage unit 170.

FIG. 11B is the second example of the other CMOS transistor level design of the latch 100 of the present embodiment. The example of FIG. 11B is different from the example of FIG. 11A in that the two pMOSFETs M7 and M8 are replaced with a pMOSFET M14.

In the example of FIG. 11B, when one of the transistors M1 and M2 is turned on and another of the transistors M1 and M2 is partially turned on, and the clock CK is "low", the nodes a and b are precharged. Furthermore, a pMOSFET M14 is arranged between the nodes a and b to shorten the time required for equalizing the voltage levels of the node a and the node b at the precharge time.

When the clock CK is "low" and V(INB) is greater than V(IN), a current $I_{15}$ passes through M15 and flows to the node c from Vdd, a current $I_1$ passes through M1 and flows to the node a, and a current $I_2$ passes through M2 and flows from the node c to the node b and further passes through M14 and flows from the node b to the node a.

An overall relation of the currents $I_1$, $I_2$, and $I_{15}$ is represented as:

$$I_{15} = I_2 + I_1$$

$$I_2 > I_1$$

This transistor level design is used when the power supply voltage Vdd is relatively low, for example, 2Vth to 4Vth.

Figure 12A:
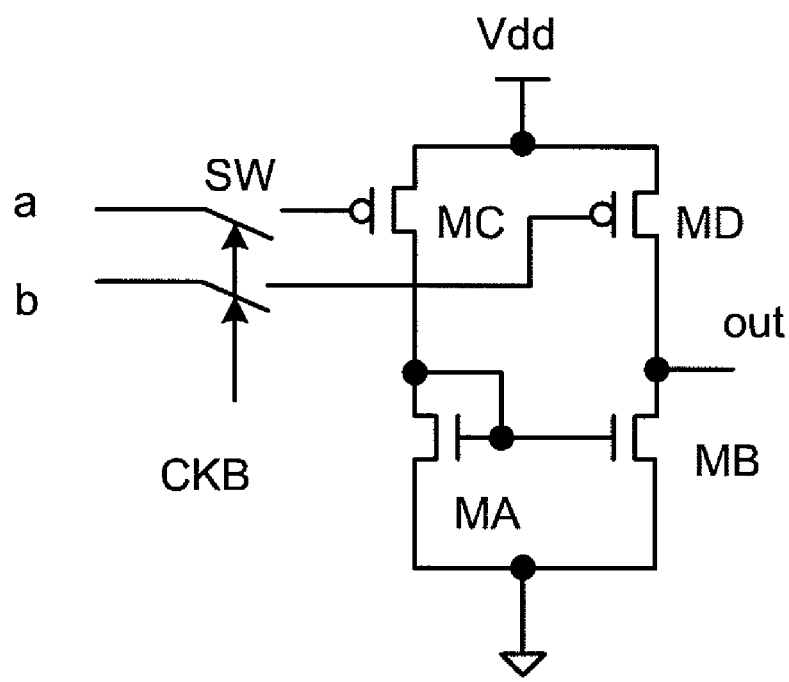
FIG. 12A is a circuit diagram of a first example of a transistor level design of a voltage level storage unit.

FIG. 12A shows a first example of a transistor level design of the voltage level storage unit 170 shown in FIGS. 11A and 11B. The first example of the voltage level storage unit 170 shown in FIG. 12A includes two differential inputs a and b and one single end output out. Two switches SW can be implemented by an nMOSFET, a pMOSFET, or by a combination of the nMOSFET and the pMOSFET.

Figure 12B:
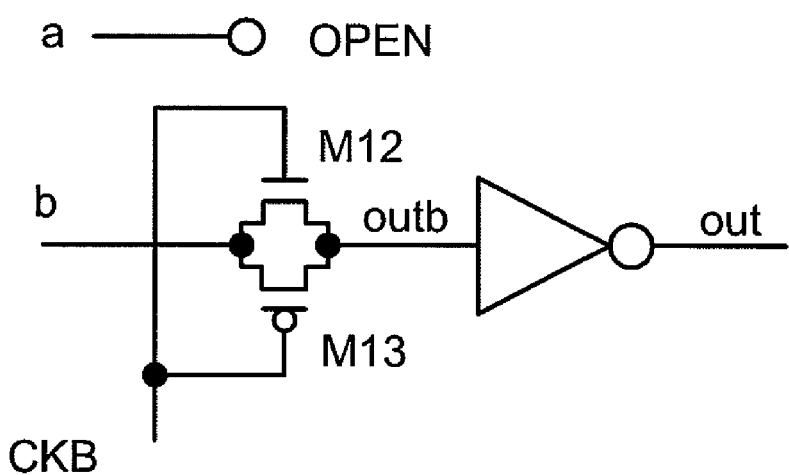
FIG. 12B is a circuit diagram of a second example of the transistor level design of the voltage level storage unit.

FIG. 12B is a second example of the transistor level design of the voltage level storage unit 170. The second example of the voltage level storage unit 170 shown in FIG. 12B includes one differential input b and one single end output out. In this example, a combination of the nMOSFET (M12) and the pMOSFET (M13) is used to remove the noise at the time of switching. The example of FIG. 12B corresponds to the transistor level design shown in FIG. 3A and the node a is open.

In the present embodiment, because the memory logic unit 120 and the input amplifying unit 130 are arranged in the same transistor level, the delay time can be shortened and the maximum operating frequency can be enhanced. Furthermore, the power supply voltage Vdd is reduced, and power consumption can be reduced.

In the present embodiment, because the current supply 150 controls the current flowing through the memory logic unit 120, the speed of data latching by the memory logic unit 120 can be increased and the noise can be reduced.

Figure 13:
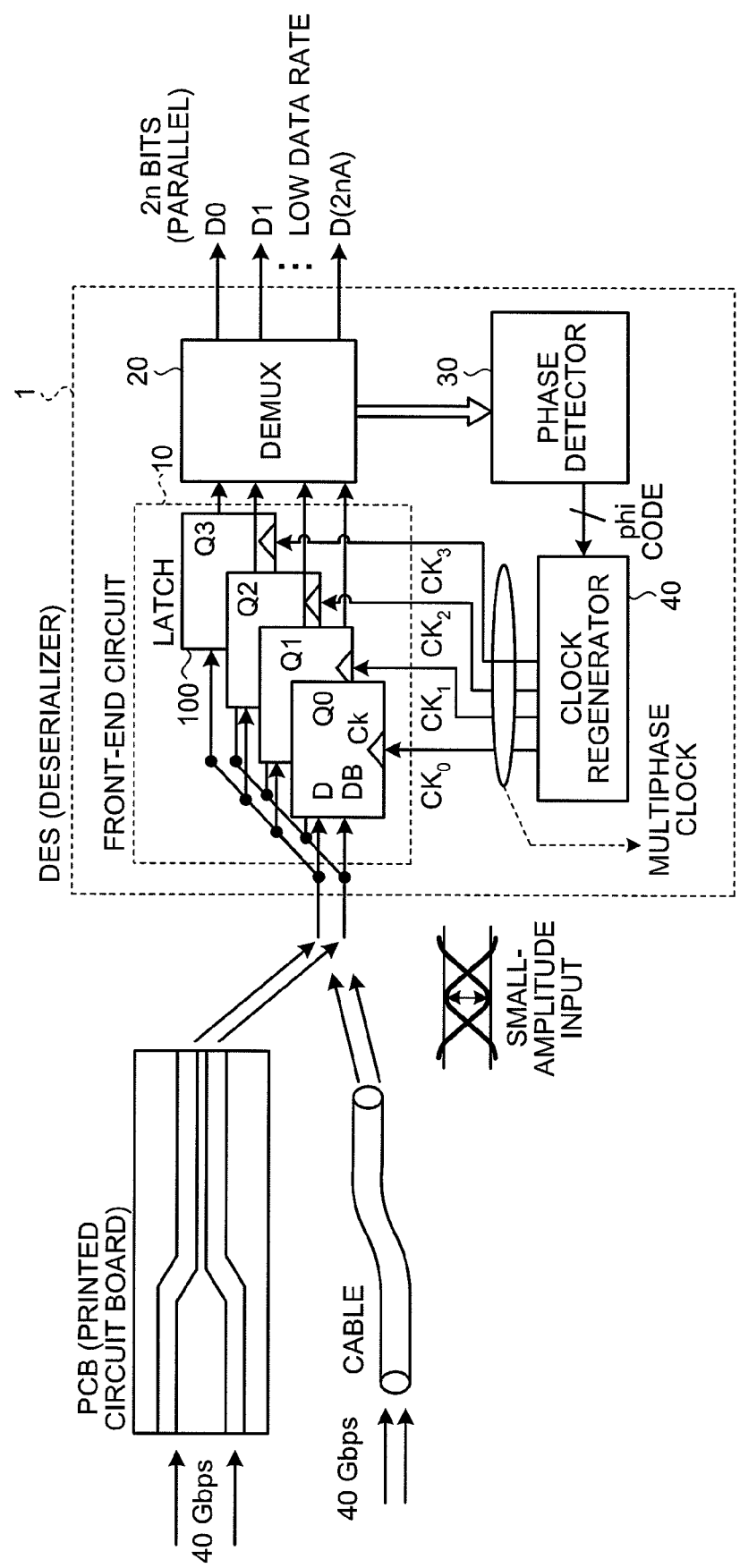
FIG. 13 is a functional block diagram of a deserializer that receives small-amplitude signals as an input from a printed circuit board or a cable.
Figure 14A:
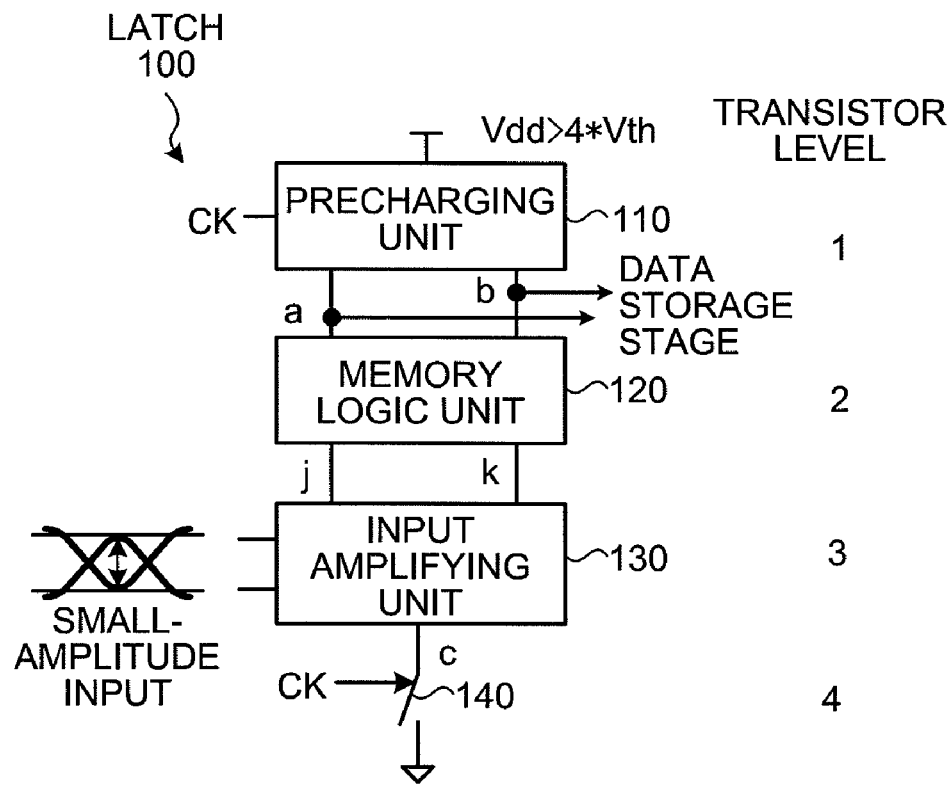
FIG. 14A is a functional block diagram of a commonly used latch that is compatible with a small-amplitude input.
Figure 14B:
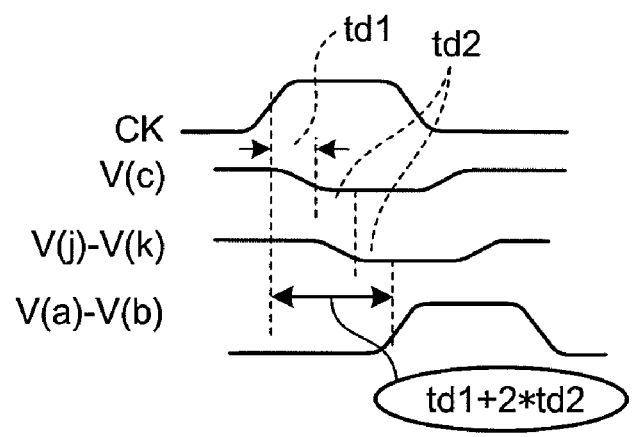
FIG. 14B is a timing chart of the latch shown in FIG. 14A.

In the present embodiment, the deserializer 1 that receives the optical signals of 40 Gbps is explained. As shown in FIG. 13, the deserializer 1 can receive the small-amplitude signals as an input from a printed circuit board or a cable. Any type of the printed circuit board can be used and the cable to be used can be a grounded shield wire or a grounded jacket cable. As shown in FIG. 13, in a high-speed transmission system where the transmission speed is higher than 10 Gbps, a signal line of differential input is usually used.

The latch 100 and elements thereof according to the present embodiment can be implemented either by using the LSI or on the printed circuit board on which electronic components are individually mounted or by combination of the LSI and the printed circuit board.

According to one aspect of the present invention, the transistor levels can be reduced.

According to another aspect of the present invention, a precharging circuit can be easily mounted.

According to still another aspect of the present invention, time required for storage of data in the memory logic circuit, which stores the data, can be reduced, whereby the delay time of the latch circuit can be shortened.

According to still another aspect of the present invention, the precharging circuit can be easily mounted.

According to still another aspect of the present invention, a clock synchronization switch can be easily mounted.

According to still another aspect of the present invention, time required for precharging a voltage to two latch output nodes can be reduced, whereby the delay time of the latch circuit can be shortened.

According to still another aspect of the present invention, a power supply voltage can be lowered.

According to still another aspect of the present invention, the number of transistor levels of the latch circuit can be reduced, and the latch circuit can operate at high speed, whereby the number of latch circuits employed in the deserializer can be reduced.

According to still another aspect of the present invention, since the number of transistor levels is reduced, the delay time of the latch circuit is shortened and the maximum operating frequency can be enhanced. In addition, the power supply voltage can be lowered to save power consumption.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A latch circuit comprising:
an input amplifying circuit that amplifies input signals;
a memory logic circuit that stores data included in the input signals using signals that are amplified by the input amplifying circuit;
a precharging circuit that preliminarily sets voltages of two latch output nodes to "high", the two latch output nodes being employed for an output of data stored in the memory logic circuit;
a clock synchronization switch that controls a current flowing through the input amplifying circuit;
a current supply circuit that controls the current flowing through the memory logic circuit; and
a reverse clock synchronization switch that preliminarily sets a voltage of a node connecting the memory logic circuit and the current supply circuit to "high", wherein
the precharging circuit and the reverse clock synchronization switch are arranged in a first transistor level at a power supply side,
the input amplifying circuit and the memory logic circuit are arranged in a second transistor level,
the clock synchronization switch and the current supply circuit are arranged in a third transistor level at a ground side, and
the memory logic circuit is connected to the current supply circuit.

2. The latch circuit according to claim 1, wherein the precharging circuit is configured with four pMOS transistors.

3. The latch circuit according to claim 1, wherein the clock synchronization switch is configured with an n-type metal-oxide semiconductor (nMOS) transistor.

4. The latch circuit according to claim 1, further comprising:
a pMOS transistor that preliminarily sets a voltage of a node connecting the input amplifying circuit and the clock synchronization switch in the first transistor level.

5. A latch circuit comprising:
an input amplifying circuit that amplifies input signals;
a memory logic circuit that stores data included in the input signals using signals that are amplified by the input amplifying circuit;
a precharging circuit that preliminarily sets voltages of two latch output nodes to "high", the two latch output nodes being employed for an output of data stored in the memory logic circuit;
a clock synchronization switch that controls a current flowing through the input amplifying circuit;
a current supply circuit that controls the current flowing through the memory logic circuit; and
a p-type metal-oxide semiconductor (pMOS) transistor that preliminarily sets a voltage of a node connecting the memory logic circuit and the current supply circuit to "high", wherein
the precharging circuit and the pMOS transistor are arranged in a first transistor level at a power supply side,
the input amplifying circuit and the memory logic circuit are arranged in a second transistor level,
the clock synchronization switch and the current supply circuit are arranged in a third transistor level at a ground side, and
the memory logic circuit is connected to the current supply circuit.

6. The latch circuit according to claim 5, wherein the precharging circuit is configured with four pMOS transistors.

7. The latch circuit according to claim 5, wherein the clock synchronization switch is configured with an nMOS transistor.

8. The latch circuit according to claim 5, further comprising
a pMOS transistor that preliminarily sets a voltage of a node connecting the input amplifying circuit and the clock synchronization switch in the first transistor level.

9. The latch circuit according to claim 5, further comprising
a pMOS transistor that connects the two latch output nodes.

10. A deserializer circuit comprising:
a latch circuit as a front-end circuit that includes,
an input amplifying circuit that amplifies input signals;
a memory logic circuit that stores data included in the input signals using signals that are amplified by the input amplifying circuit;
a precharging circuit that preliminarily sets voltages of two latch output nodes to "high", the two latch output nodes being employed for an output of data stored in the memory logic circuit;
a clock synchronization switch that controls a current flowing through the input amplifying circuit;
a current supply circuit that controls the current flowing through the memory logic circuit, and
a reverse clock synchronization switch that preliminarily sets a voltage of a node connecting the memory logic circuit and the current supply circuit to "high", wherein
the precharging circuit and the reverse clock synchronization switch are arranged in a first transistor level at a power supply side,
the input amplifying circuit and the memory logic circuit are arranged in a second transistor level,
the clock synchronization switch and the current supply circuit are arranged in a third transistor level at a ground side, and
the memory logic circuit is connected to the current supply circuit.

11. The deserializer circuit according to claim 10, wherein the precharging circuit is configured with four pMOS transistors.

12. The deserializer circuit according to claim 10, wherein the clock synchronization switch is configured with an nMOS transistor.

13. The deserializer circuit according to claim 10, further comprising
a pMOS transistor that preliminarily sets a voltage of a node connecting the input amplifying circuit and the clock synchronization switch in the first transistor level.

14. A deserializer circuit comprising:
a latch circuit as a front-end circuit that includes,
an input amplifying circuit that amplifies input signals;
a memory logic circuit that stores data included in the input signals using signals that are amplified by the input amplifying circuit;
a precharging circuit that preliminarily sets voltages of two latch output nodes to "high", the two latch output nodes being employed for an output of data stored in the memory logic circuit;
a clock synchronization switch that controls a current flowing through the input amplifying circuit;
a current supply circuit that controls the current flowing through the memory logic circuit, and
a pMOS transistor that preliminarily sets a voltage of a node connecting the memory logic circuit and the current supply circuit to "high", wherein
the precharging circuit and the pMOS transistor are arranged in a first transistor level at a power supply side,
the input amplifying circuit and the memory logic circuit are arranged in a second transistor level,
the clock synchronization switch and the current supply circuit are arranged in a third transistor level at a ground side, and
the memory logic circuit is connected to the current supply circuit.

15. The deserializer circuit according to claim 14, wherein the precharging circuit is configured with four pMOS transistors.

16. The deserializer circuit according to claim 14, wherein the clock synchronization switch is configured with an nMOS transistor.

17. The deserializer circuit according to claim 14, further comprising
a pMOS transistor that preliminarily sets a voltage of a node connecting the input amplifying circuit and the clock synchronization switch in the first transistor level.

18. The deserializer circuit according to claim 14, further comprising
a pMOS transistor that connects the two latch output nodes.

* * * * *